US008618406B1

(12) United States Patent
Bilak et al.

(10) Patent No.: US 8,618,406 B1
(45) Date of Patent: Dec. 31, 2013

(54) THERMOELECTRIC POWER GENERATION METHOD AND APPARATUS

(75) Inventors: Mark Ronald Bilak, Fuquay-Varina, NC (US); Ronald Edward Bilak, Seneca Falls, NY (US)

(73) Assignee: B & B Innovators, LLC, Fuquay-Varina, NC (US)

( * ) Notice: Subject to any disclaimer, the term of this patent is extended or adjusted under 35 U.S.C. 154(b) by 1100 days.

(21) Appl. No.: 12/032,769

(22) Filed: Feb. 18, 2008

(51) Int. Cl.
  *H01L 35/00* (2006.01)
(52) U.S. Cl.
  USPC ............ 136/201; 136/200; 136/205; 136/206
(58) Field of Classification Search
  USPC .......................................... 136/200, 201, 205
  See application file for complete search history.

(56) References Cited

U.S. PATENT DOCUMENTS

| | | | | |
|---|---|---|---|---|
| 4,753,682 | A | * | 6/1988 | Cantoni ........................ 136/212 |
| 5,427,086 | A | * | 6/1995 | Brownell .................. 126/110 R |
| 5,929,372 | A | * | 7/1999 | Oudoire et al. ............... 136/208 |
| 5,959,240 | A | * | 9/1999 | Yoshida et al. ............... 136/205 |
| 6,262,543 | B1 | * | 7/2001 | Ozawa et al. .................. 315/383 |
| 6,269,645 | B1 | | 8/2001 | Yamaguchi |
| 6,570,362 | B1 | * | 5/2003 | Estes et al. .................... 320/101 |
| 6,613,972 | B2 | * | 9/2003 | Cohen et al. .................. 136/209 |
| 2003/0066554 | A1 | * | 4/2003 | Feher ............................ 136/200 |
| 2004/0094192 | A1 | * | 5/2004 | Luo ............................... 136/203 |
| 2005/0139248 | A1 | * | 6/2005 | Strnad .......................... 136/205 |
| 2007/0034245 | A1 | * | 2/2007 | Nakajima ..................... 136/205 |

OTHER PUBLICATIONS

Becklake et al., "Polarity reversal in the detected output of a point contact diode", IEEE, 1969.*
Buist et al., "Thermoelectric Power Generator Design and Selection from TE cooling Module Specification", XVI International Conference on Thermoelectrics, Dresden, Germany, Aug. 26-29, 1997.
"Power Supplies", © John Hewes 2007, The Electronics Club, http://www.kpsec.freeuk.com/powersup.htm.
"Chargers and Charging", © Woodbank Communications Ltd 2005, http://www.mpoweruk.com/chargers.htm.
Burke et al., "Thermoelectric Coolers as Power Generators", 18th Intersociety Energy Conversion Engineering Conference, Orlando, Florida, Aug. 21-26, 1983.

* cited by examiner

*Primary Examiner* — Jennifer Michener
*Assistant Examiner* — Matthew Martin
(74) *Attorney, Agent, or Firm* — Mark R. Bilak

(57) ABSTRACT

Power is generated using a thermoelectric power generation unit. The thermoelectric power generation unit has at least one thermoelectric module disposed between a first heat sink arranged inside the thermoelectric power generation unit and a second heat sink arranged outside the thermoelectric power generation unit. The thermoelectric power generation unit is inserted into a ducting network carrying relatively hot air during some periods of time and relatively cold air during other periods of time so that the relatively hot and cold air flows through the thermoelectric power generation unit during the different periods of time. The thermoelectric power generation unit generates power when the ducting network carries either the relatively hot or cold air. Energy is stored at least partially based on the power generated by the thermoelectric power generation unit.

20 Claims, 7 Drawing Sheets

THERMOELECTRIC POWER GENERATION METHOD AND APPARATUS

BACKGROUND OF THE INVENTION

The present invention generally relates to power generation, and particularly relates to generating power using thermoelectric modules.

Many residential and industrial applications generate hot air by way of fuel combustion, chemical reaction or the like, e.g., from boilers, kilns, ovens, furnaces, etc. The hot air is typically carried in a ducting network and expelled into the environment without being reused for useful purposes. The ducting network often carries cooler air during other periods of time, e.g., to provide ventilation or cooling. For example, heating and air conditioning systems have ducting networks for carrying relatively hot air during some periods of time to provide heating and relatively cold air during other periods of time to provide cooling. Heating and air conditioning systems are widely deployed in both industrial and residential settings. In each of these applications and others, a significant temperature differential usually exists between the air carried within the ducting network and the outside air. This temperature gradient often goes unutilized in conventional ducting networks.

SUMMARY OF THE INVENTION

According to the methods and apparatus taught herein, the temperature gradient between the inside and outside of a ducting network that carries relatively hot air (i.e., air hotter than the outside air) during some periods of time and relatively cold air (i.e., air colder than the outside air) during other periods of time is used to passively generate power. Power is generated whether relatively hot air flows within the ducting and the outside air is relatively cold or if the opposite condition exists. In either case, the temperature gradient is applied to thermoelectric modules which generate power based on the temperature gradient. The power generated by the thermoelectric modules is stored for later use.

According to one embodiment, a thermoelectric power generation unit comprises a plurality of walls arranged to form an enclosure, each wall having an inner surface and an outer surface. The unit also comprises at least one thermoelectric module having a plurality of p-type and n-type semiconductor elements electrically connected in series and thermally connected in parallel between first and second substrates. A first heat sink is attached to the inner surface of one of the walls and in thermal contact with the first substrate. A second heat sink is arranged outside the enclosure in thermal contact with the second substrate. An inlet is formed in one of the walls and is operable to receive a first duct and an outlet is formed in a different one of the walls and is operable to receive a second duct. An insulating material is arranged on the outer surface of the walls. The at least one thermoelectric module is operable to generate a voltage having a first polarity when relatively hot air flows in the enclosure and the opposite polarity when relatively cold air flows in the enclosure.

According to another embodiment, one or more of the thermoelectric power generation units is included in a power generation system. The power generation system also comprises a ducting network operable to carry relatively hot air during some periods of time and relatively cold air during other periods of time. The thermoelectric power generation unit is inserted into the ducting network so that the relatively hot and cold air flows through the thermoelectric power generation unit during the different periods of time. The thermoelectric power generation unit comprises at least one thermoelectric module disposed between a first heat sink arranged inside the thermoelectric power generation unit and a second heat sink arranged outside the thermoelectric power generation unit. The thermoelectric power generation unit generates power when the ducting network carries either the relatively hot or cold air. A power storage unit stores energy at least partially based on the power generated by the thermoelectric power generation unit. A power distribution network carries the power generated by the thermoelectric power generation unit to the power storage unit.

According to yet another embodiment, power is generated using a thermoelectric power generation unit. The thermoelectric power generation unit has at least one thermoelectric module disposed between a first heat sink arranged inside the thermoelectric power generation unit and a second heat sink arranged outside the thermoelectric power generation unit. The thermoelectric power generation unit is inserted into a ducting network carrying relatively hot air during some periods of time and relatively cold air during other periods of time so that the relatively hot and cold air flows through the thermoelectric power generation unit during the different periods of time. The thermoelectric power generation unit generates power when the ducting network carries either the relatively hot or cold air. Energy is stored at least partially based on the power generated by the thermoelectric power generation unit.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
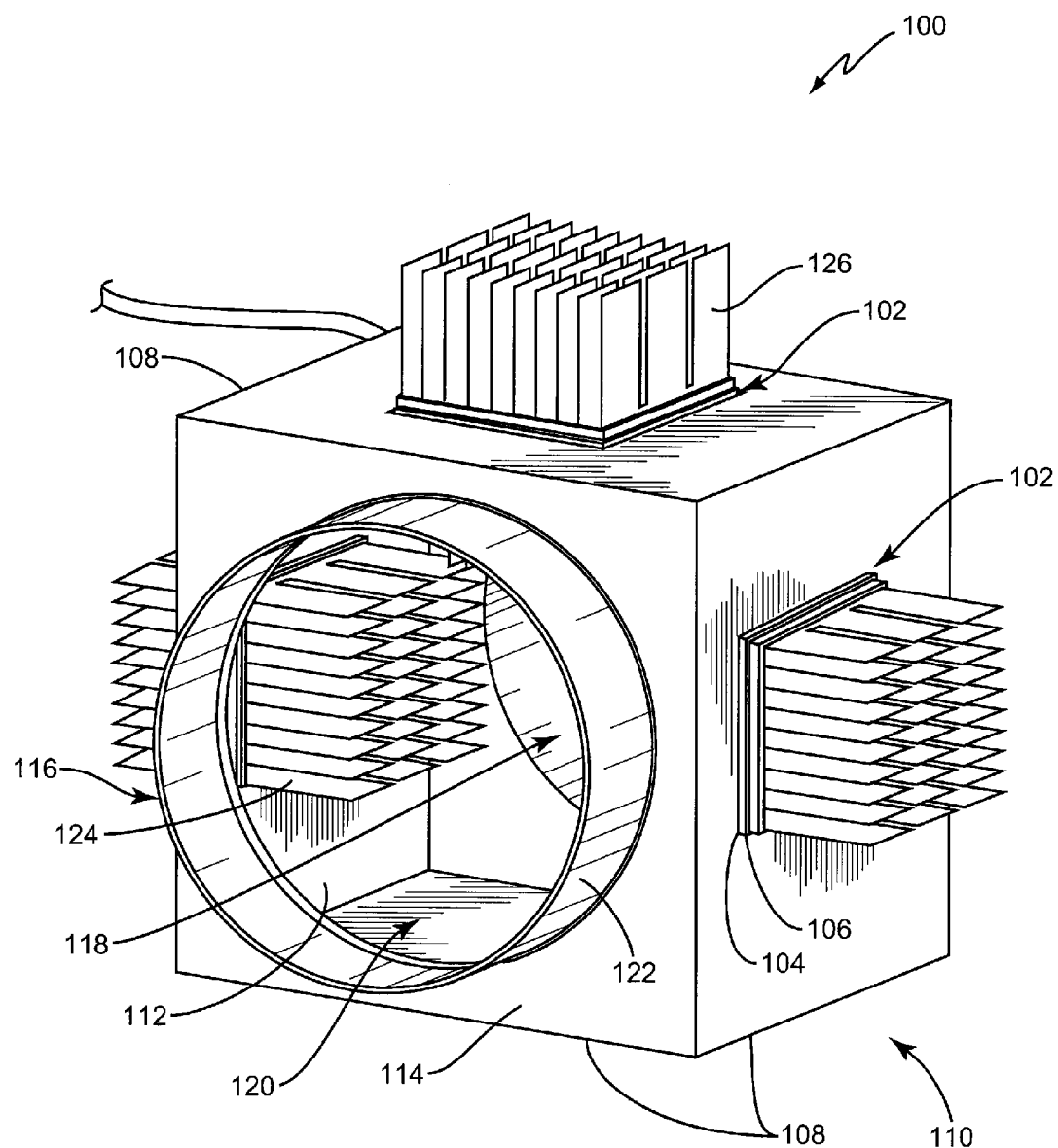
FIG. 1 is a diagram of an embodiment of a thermoelectric power generation unit.

FIG. 1 illustrates an embodiment of a thermoelectric (TE) power generation unit 100. The TE power generation unit 100 can be inserted into any ducting network (not shown in FIG. 1) for generating power when the ducting network carries relatively hot air (i.e., air hotter than that outside the unit 100)

during some periods of time and relatively cold air (i.e., air colder than that outside the unit 100) during other periods of time. The unit 100 includes at least one TE module 102. The TE module 102 has a plurality of p-type and n-type semiconductor elements electrically connected in series and thermally connected in parallel between first and second substrates 104, 106. Each TE module 102 generates a voltage proportional to a temperature differential applied across the first and second substrates 104, 106 as is well known in the art. The TE modules 102 can be arranged in any desired series and/or parallel arrangement to yield a desired output voltage. When air flowing through the unit 100 is warmer than air outside the unit 100, a heat load is applied to the first substrate 104 of each TE module 102. The heat load moves through the p-type and n-type semiconductor elements in parallel to the second substrate 106 where it is expelled from the unit 100 to the outside environment, causing current to flow through the series arrangement of semiconductor elements.

The opposite effect occurs when the airflow inside the unit 100 is cooler than the outside air. When this condition exists, heat energy moves from the second substrate 106 to the first substrate 104 where it is expelled to the unit 100, causing current to flow in the opposite direction through the series arrangement of semiconductor elements. Thus, the voltage output by each TE module 102 has a polarity that depends on the direction in which heat energy flows through the module 102. The voltage has a first polarity when relatively hot air flows through the unit 100 and the opposite polarity when relatively cold air flows through the unit 100. This enables the unit 100 to generate power whenever a temperature differential is applied across the TE module substrates 104, 106 regardless of whether the ducting network carries hot or cold air.

The TE power generation unit 100 has a plurality of walls 108 of any desired shape arranged in any desired configuration to form an enclosure 110, each wall 108 having an inner surface 112 and an outer surface 114. In one embodiment, the enclosure 110 is generally composed of straight line segments such as polygons, triangles, parallelograms, rectangles, squares, etc. In another embodiment, the enclosure 110 is generally composed of curved line segments such as circles, ovals, ellipses, etc. In yet another embodiment, the enclosure 110 is generally composed of both straight and curved line segments. As such, the enclosure 110 may take any desired shape such as a cube (as shown in FIG. 1), hypercube, sphere, n-sphere, cylinder, prism, tetrahedron, octahedron, dodecahedron, icosahedron, etc.

The enclosure 110 has an air inlet 116 formed in one of the walls 108. The air inlet 116 receives a duct (not shown). An air outlet 118 is formed in a different one of the walls 108 and receives a different duct (not shown). The air inlet 116 and air outlet 118 provide a pathway for air to pass through the enclosure 110 while being transported by the ducting network, enabling the unit 100 to generate power. In one embodiment, the air inlet 116 and air outlet 118 are formed in opposing walls 108 of the enclosure 110 to minimize pressure drop and maximize airflow within the enclosure 110. In one embodiment, both the air inlet 116 and air outlet 118 have an opening 120 and a flange 122 for receiving the respective ducts. This way, the ducts can be readily attached to and detached from the TE power generation unit 100, e.g., using slip or flange mounts for ease of unit maintenance, repair, replacement, etc.

The TE power generation unit 100 further includes an inner heat sink 124 and an outer heat sink 126 in thermal contact with each TE module 102. Each TE module 102 may share the same inner heat sink 124 and the same outer heat sink 126. Alternatively, each module 100 may have its own inner and outer heat sinks 124, 126 (as shown in FIG. 1) or some combination thereof. Regardless, the inner heat sink 124 is attached to the inner wall surface 112 and is in thermal contact with the first substrate 104 of one (or more) of the TE modules 102. The outer heat sink 126 is arranged outside the enclosure 110 in thermal contact with the second substrate 106 of the same TE module(s) 102. Thus, each TE module 102 is effectively "sandwiched" between the inner and outer heat sinks 124, 126, the inner heat sink 124 being disposed inside the enclosure 110 and the outer heat sink 126 being disposed outside the enclosure 110. An insulating material 308 (shown in FIG. 3) is arranged on the outer surface 114 of the walls 108 except in the region of the TE modules 102 for reducing parasitic energy loss when hot or cold air flows through the unit 100.

Figure 2A:
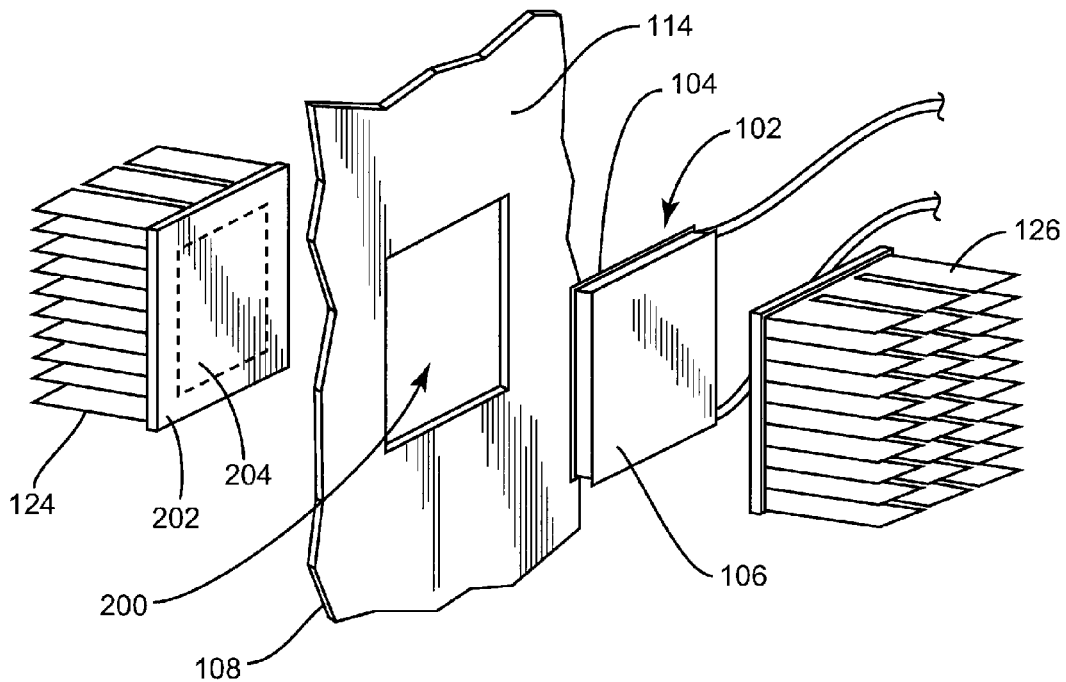
FIG. 2A is an exploded view of one embodiment of the thermoelectric power generation unit of FIG. 1.

FIG. 2A illustrates an exploded view of one embodiment of the interface between the TE modules 102, enclosure walls 108 and heat sinks 124, 126. According to this embodiment, the first TE module substrate 104 contacts the inner heat sink 124 through an opening 200 formed in one of the walls 108. The opening 200 may be slightly larger than the surface area of the TE module 102 so that the entire first substrate 104 fits through the opening 200. According to this embodiment, the inner heat sink 124 has a total surface area greater than that of the first substrate 104 so that the outer surface area 202 of the heat sink 124 can be attached to the inner surface 112 of the wall 108 via a thermally conductive material such as thermally conductive tape, thermally conductive epoxy, low temperature solder, etc. The inner surface area 204 of the inner heat sink 124 is attached to the first substrate 104 through the opening 200 in the wall 108 via a thermally conductive material. Thus, the outer portion 202 of the inner heat sink 124 is attached to the inner wall surface 112 while the inner portion 204 of the inner heat sink 124 is attached to the first substrate 104 of the TE module 102. The TE module 102 is sufficiently attached to the enclosure 110 while providing a low thermal resistance interface between the inner heat sink 124 and TE module 102. Attaching the TE module 102 to the enclosure 110 in this way enables the TE module 102 to transfer a greater head load across this interface, improving TE module efficiency.

In another embodiment, the opening 200 formed in the enclosure wall 108 is smaller than the total surface area of the first substrate 104. This way, the outer surface area of the first substrate 104 can be attached to the outer wall surface 114. The outer surface area 202 of the inner heat sink 124 is similarly attached to the inner wall surface 112 in the region of the first substrate 104. A good thermal interface can be maintained between the inner heat sink 124 and the inner surface area 202 of the first substrate 104 by filling the gap between the heat sink 124 and substrate 104 in the region of the wall opening 200 with a good thermal conductor such as a thermally conductive adhesive, epoxy, paste or grease.

Figure 2B:
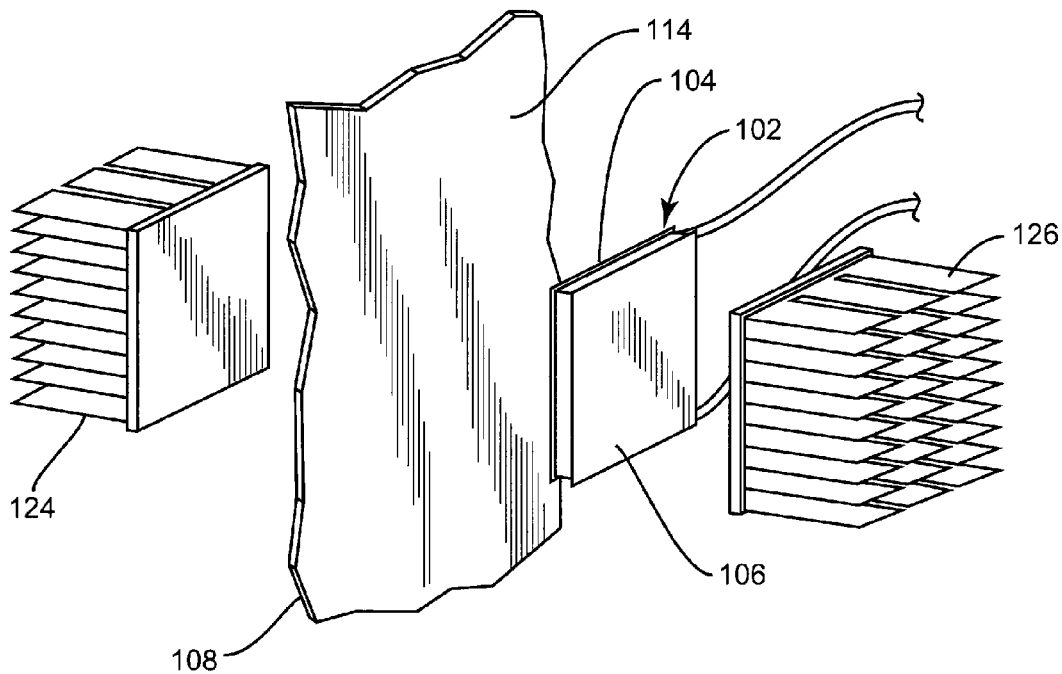
FIG. 2B is an exploded view of another embodiment of the thermoelectric power generation unit of FIG. 1.

FIG. 2B illustrates an exploded view of yet another embodiment of the interface between the TE modules 102, enclosure walls 108 and heat sinks 124, 126. According to this embodiment, the total surface area of the inner heat sink 124 is attached to the inner surface 112 of the wall 108, e.g., via a thermally conductive material. The first substrate 104 of the TE module 102 is attached to the outer surface 114 of the same wall 108 in a region of the first heat sink 124, e.g., also via a thermally conductive material. This arrangement provides good mechanical stability, but reduces thermal performance because the wall 108 is disposed between the inner heat sink 124 and the TE module 102, increasing the thermal resistance of the junction. The corresponding outer heat sink 126 is attached to the second substrate 106 of the same TE module 102 using a thermally conductive material. Alternatively, the heat sinks 124, 126 and TE module 102 may be attached to the wall 108 via a mechanical fastener (not shown) such as a bolt, screw, strap, etc.

Regardless, arranging one of the heat sinks 124 inside the enclosure 110 and the other heat sink 126 outside the enclosure 110 enables the unit 100 to efficiently generate power regardless of whether hot or cold air flows through the unit 100. The unit 100 generates power so long as a temperature differential is maintained across each TE module 102 regardless of the polarity of the temperature differential. The inner and outer heat sinks 124, 126 together provide this capability by increasing the amount of heat energy that can be transferred from one substrate of the TE modules 102 to the opposing substrate. For example, if only the outer heat sink 126 is provided, the unit 100 would generate ample power when hot air flows through the unit 100 and the air outside the unit is cold. Under these conditions, the zeroth law of thermodynamics dictates that heat energy transfers from the warm side (inside the enclosure) to the cold side (outside the enclosure) until equilibrium is reached. Accordingly, it is the efficiency (i.e., thermal resistance) of the outer heat sink 126 that determines whether a sufficient temperature gradient can be maintained across each TE module 102. However, the same does not hold true when relatively cold air flows through the unit 100 and the outside air is warmer. Under these conditions, heat energy transfers from the outer heat sink 126 to the first substrate 104 of each TE module 102. Without the inner heat sink 124, the unit 100 cannot efficiently expel the heat energy from the first substrate 104 to the cold air mass flowing through the enclosure 110. Accordingly, a useful temperature gradient cannot be maintained across each TE module 102 without the inner heat sink 124, essentially limiting the power generation capacity of the unit 100 to hot air flow only.

Providing both the inner and outer heat sinks 124, 126 ensures that an adequate temperature gradient can be maintained across each TE module 102 regardless of whether relatively hot or cold air flows through the enclosure 100, enabling the unit 100 to generate appreciable power under either condition. The outer heat sink 126 efficiently expels heat energy to the cooler outside air when relatively hot air flows through the unit 100. The inner heat sink 124 efficiently expels heat energy to the air flowing inside the enclosure 110 when the outside air is relatively warm and cold air flows through the unit 100. An adequate temperature differential is maintained across each TE module 102 under either condition, enabling the unit 100 to generate power regardless of whether hot or cold air flows through the enclosure 110.

The type and capacity of each heat sink 124, 126 employed is a function of the thermal resistance (° C./Watt) needed to generate a desired power level under particular operating conditions. Many variables influence the maximum thermal resistance of the inner and outer heat sinks 124, 126 such as the average outside air temperature when relatively cold air flows through the unit 100, the average outside air temperature when relatively hot air flows through the unit 100, air flow rate through the unit 100, TE module power generation capacity, enclosure material, enclosure shape, adhesive thermal conductivity, hot-side heat load, cold-side heat load, etc. Broadly, any type and capacity of heat sink 124, 126 may be employed in the TE power generation unit 100 such as passive heat sinks, active heat sinks, heat spreaders, heat pipes, liquid-cooled heat sinks, extruded fin, stamped fin, brazed fin, folded fin, forged, bonded, cross-cut, etc.

Figure 3:
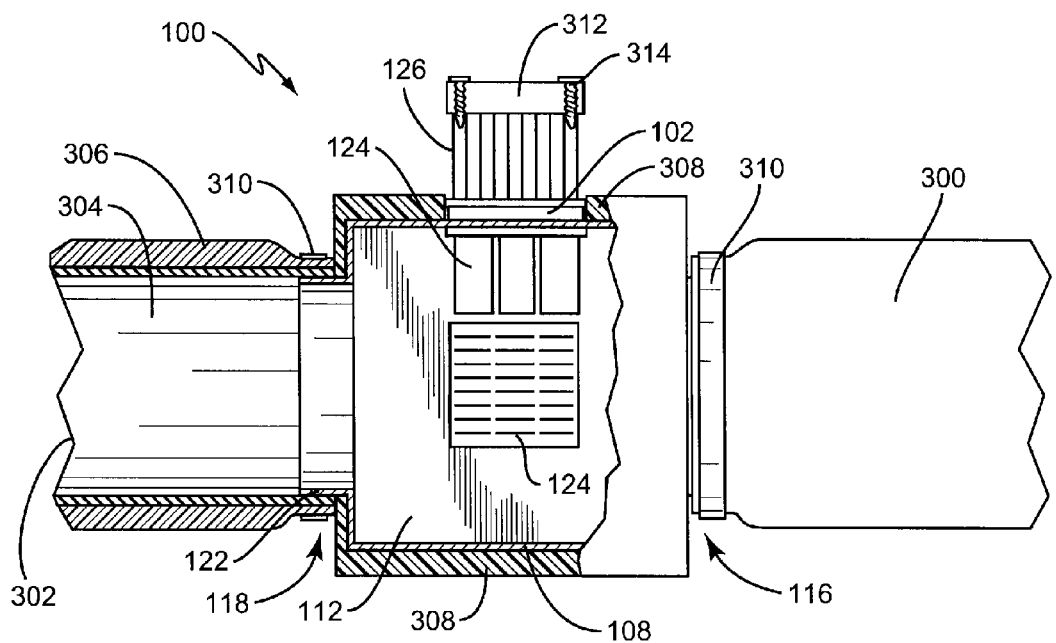
FIG. 3 is a diagram of an embodiment of a thermoelectric power generation unit inserted into a ducting network.

FIG. 3 is a cut away view of another embodiment of the TE power generation unit 100. According to this embodiment, the outer heat sink 126 is a fin-type heat sink. A first duct 300 is attached to the flange 122 of the air inlet 116 of the unit 100. A second duct 302 is similarly attached to flange 122 of the air outlet 118. Each duct 300, 302 has an inner chamber 304 for carrying air and an outer insulating layer 306 such as an insulating jacket. The unit 100 also has an insulating layer 308 for reducing parasitic energy loss to the environment outside the enclosure 110. In one embodiment, the insulating layer 308 is attached to the outside surface 114 of the enclosure walls 108 except in the region of the TE modules 102, e.g., using a glue, epoxy, tape or other adhesive. In another embodiment, the insulating layer 308 is an insulating jacket placed over the enclosure 110 except in the region of the TE modules 102. Regardless, air passes from the first duct 300 to the second duct 302 through the unit 100. In one embodiment, the first and second ducts 300, 302 are attached to the unit 100 via a mount 310 such as a slip or flange mount so that the ducts 300, 302 can be easily attached and detached, e.g., for ease of unit maintenance, repair, replacement, etc.

A fan 312 can be attached to the outer heat sink 126 via one or more fasteners 314 such as a screw (as shown in FIG. 3), epoxy, strap, clip, etc. The heat load capacity of the outer heat sink 126 increases when the fan 312 is powered because air is forced across the fins of the outer heat sink 126. This in turn increases the temperature gradient that can be maintained across the TE module 102 thermally coupled to the outer heat sink 126, increasing the power generated by the module 102. In one embodiment, the fan 312 is powered based on at least a portion of the power generated by the TE modules 102 included in the unit 100. This way, a portion of the power generated by the unit 100 can power the fan 312 which in turn enables the corresponding TE module 102 to either sustain or increase its voltage output.

Figure 4:
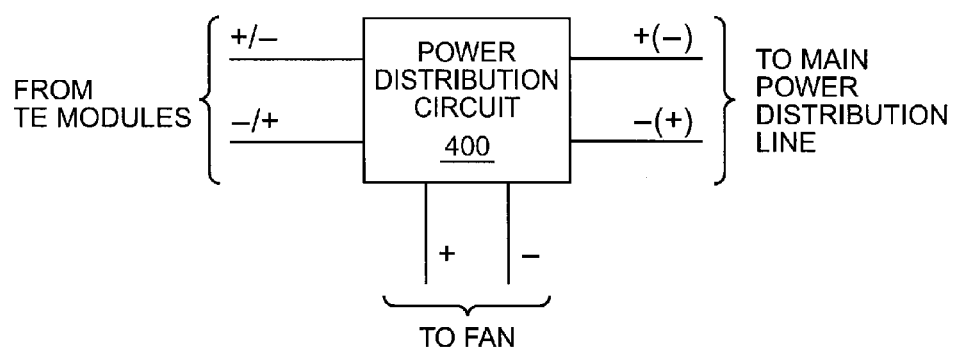
FIG. 4 is a block diagram of an embodiment of a power distribution circuit attached to a thermoelectric power generation unit.

FIG. 4 illustrates an embodiment of a power distribution circuit 400 attached to the TE power generation unit 100. The power distribution circuit 400 diverts a portion of the power generated by the unit 100 to the fan 312 for powering the fan 312. In one embodiment, the power distribution circuit 400 comprises a rectifier and a voltage divider. The rectifier converts the dual-polarity TE module output voltage to a single polarity. The voltage divider outputs the voltage applied to the fan 312. The remainder of the power generated by the unit 100 is provided to a main power distribution line as will be described in more detail later. The power distribution circuit 400 can be attached to the unit 100 via any suitable mechanism.

Figure 5:
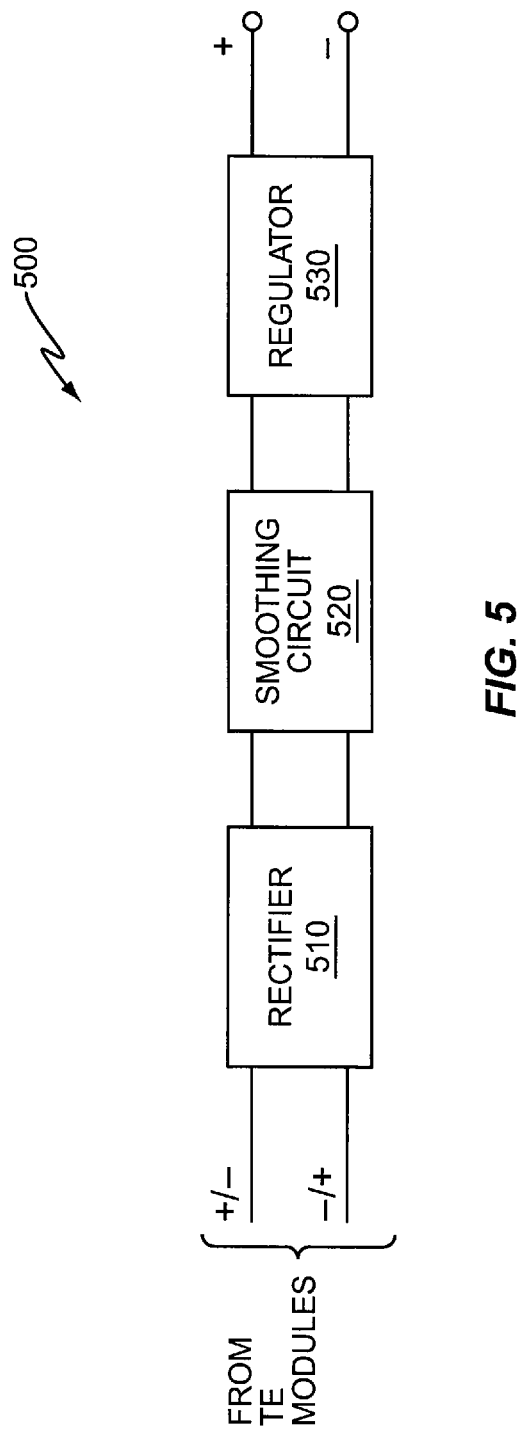
FIG. 5 is a block diagram of an embodiment of voltage regulation circuitry attached to a thermoelectric power generation unit.

FIG. 5 illustrates an embodiment of voltage regulation circuitry 500 attached to the TE power generation unit 100. The voltage regulation circuitry 500 converts the voltage output by each TE module 102 to a relatively fixed voltage having the same polarity whether relatively hot or cold air flows in the enclosure 110. The polarity of the voltage generated by each TE module 102 is a function of the polarity of the temperature gradient applied across each TE module 102 as is well known in the art. Thus, the voltage polarity changes when the temperature gradient across each TE module 102 changes from positive to negative or vice-versa. As such, each TE module 102 outputs a positive voltage under some temperature conditions and a negative voltage under other temperature conditions. The voltage regulation circuitry 500 converts the voltage to a fixed-polarity DC (direct current) voltage regardless of whether hot or cold air flows in the enclosure 110.

According to one embodiment, the voltage regulation circuitry 500 includes a rectifier 510 such as a full-wave or half-wave rectifier that converts the TE module voltage output to a varying DC voltage with only positive value. The voltage regulation circuit 500 can also include a smoothing circuit 520 for smoothing the DC voltage so that it has only relatively small or negligible ripples. The smoothing circuit 500 can be included when the output of the TE modules 102 is expected to change often, resulting in an alternating current-like output. This condition exists when the temperature gradient across the TE modules 102 fluctuates often. Otherwise, the smoothing circuit 520 can be excluded. A regulator 530 effectively eliminates any remaining ripple by setting the DC voltage to a fixed voltage. A transformer (not shown) may be included if the voltage output by the TE modules 102 is relatively high or low. The transformer can reduce or "step-down" a relatively high voltage to a relatively low voltage. Alternatively, the transformer can increase or "step-up" a relatively low voltage to a relatively high voltage. In another embodiment, a shunt regulator (not shown) is used to convert the TE module voltage output to a constant DC voltage.

The TE power generation unit 100 may also include an indicator (not shown) such as one or more LEDs (light-emitting diodes) or a display electrically coupled either to the TE modules 102 or to the voltage regulation circuitry 500 for indicating when the unit 100 is generating an appreciable voltage. Part of the power generated by the unit 100 can be used to power the indicator. In one embodiment, a single LED or other type of illuminating device is used to indicate whether the unit 100 is either generating power or not. That is, the single LED illuminates when the voltage output by the unit 100 is above a threshold and does not illuminate when the voltage is below the threshold. In another embodiment, two or more LEDs or other type of illuminating device can be used to indicate more granular voltage levels. The LEDs illuminate one after the other as the voltage output by the unit 100 exceeds different thresholds. In yet another embodiment, the indicator includes an analog-to-digital (ADC) converter and a display (not shown). The voltage output by the unit 100 is converted to a control signal by the ADC converter. The display illuminates a range of voltage values corresponding to different states of the control signal. For example, the display may show the voltage output by the TE power generation unit in one hundred millivolt increments or any other desired increment.

Figure 6:
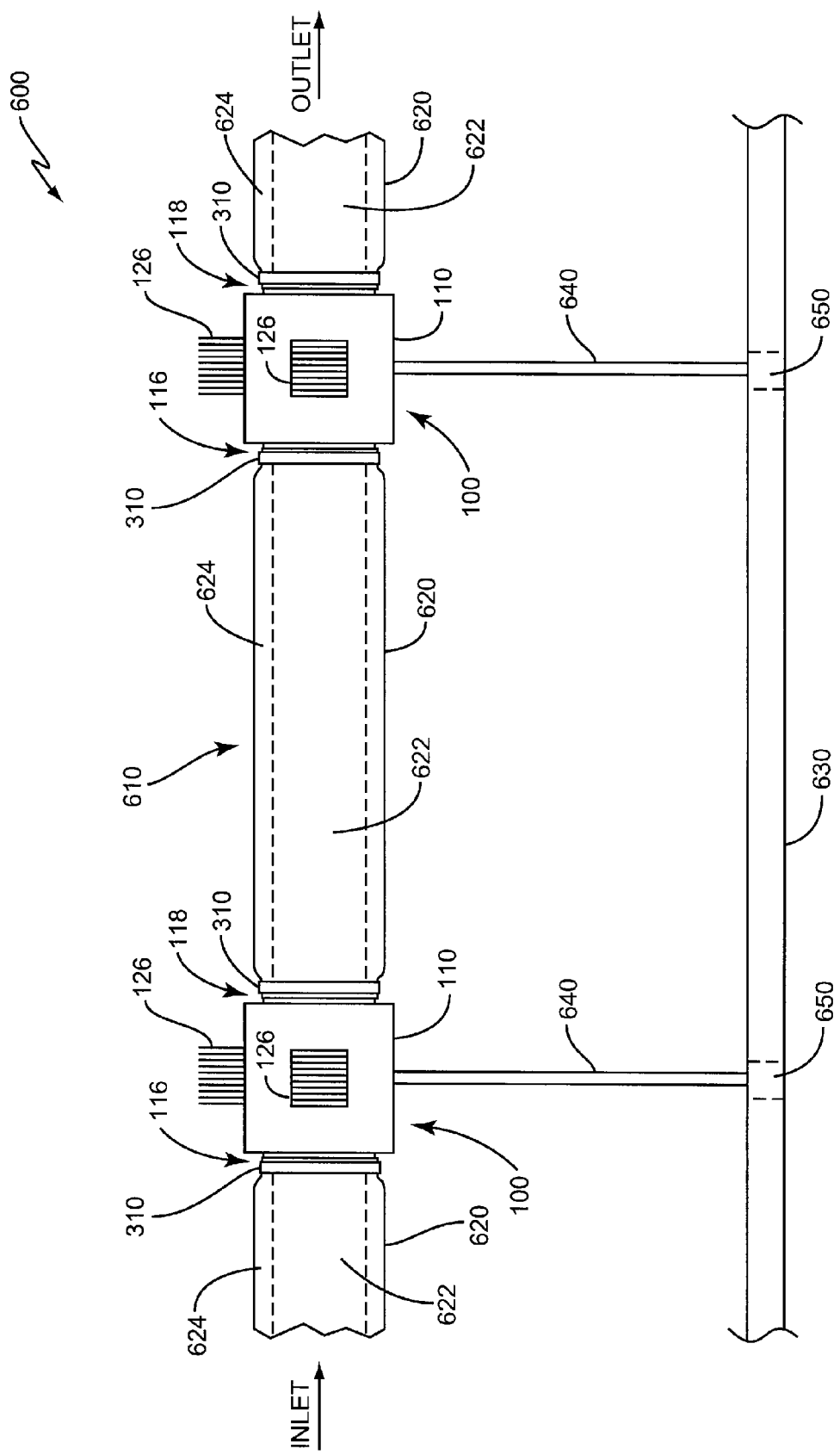
FIG. 6 is a diagram of an embodiment of a power generation system including a thermoelectric power generation unit inserted into a ducting network.
Figure 7:
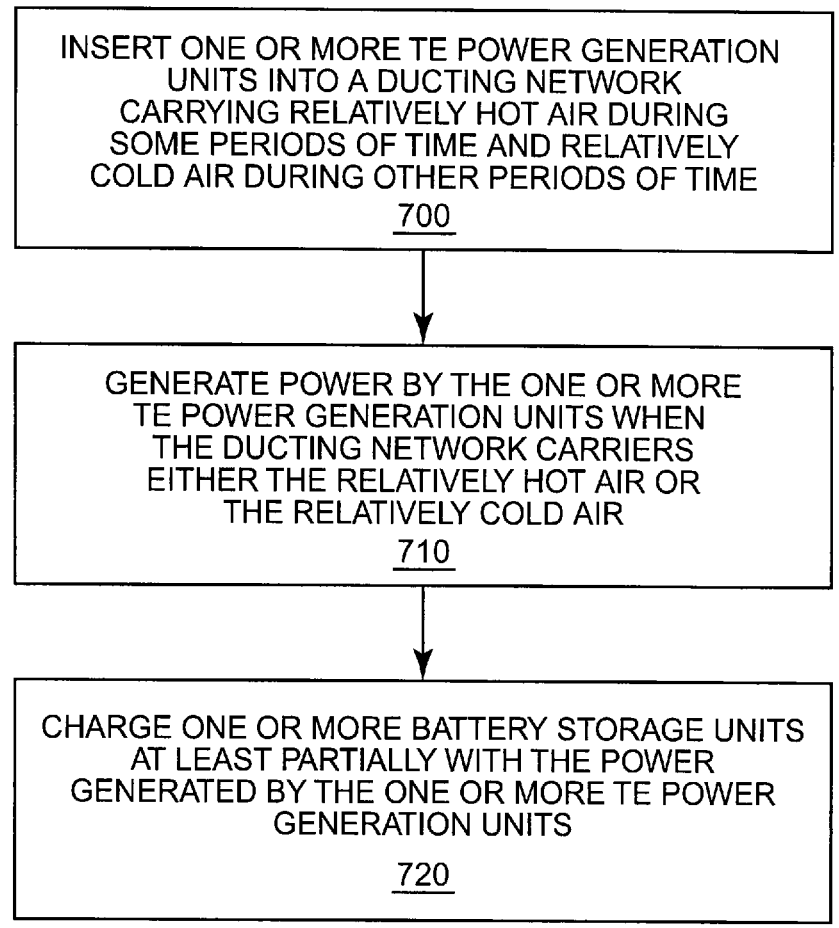
FIG. 7 is a logic flow diagram of an embodiment of generating power using a thermoelectric power generation unit.

FIG. 6 illustrates an embodiment of a power generation system 600 including one or more of the TE power generation units 100. Each unit 100 is inserted into a ducting network 610, e.g., as illustrated by Step 700 of FIG. 7. In one embodiment, the ducting network 610 carries heat generated by way of fuel combustion, chemical reaction or the like, e.g., from a boiler, kiln, oven, furnace, etc. The ducting network 610 carries cooler air during other periods of time, e.g., to provide ventilation or cooling. In another embodiment, the ducting network 610 is connected to a heating and air conditioning system (not shown) that provides relatively hot air during some periods of time and relatively cold air during other periods of time. The ducting network 610 may be coupled to any type of heating/cooling source and may deployed in any type of environment including, but not limited to, industrial and residential settings. Broadly, the ducting network 610 carries relatively hot air during some periods of time and relatively cold air during other periods of time.

The air inlet 116 of each TE power generation unit 100 is attached to a duct 620 of the ducting network 610. The duct has an inner hollow chamber 622 for carrying air and an outer insulating layer or jacket 624. The air outlet 118 of each unit 100 is attached to a different one of the ducts 620. This way, air flows between the ducts 620 through each unit 100. Each unit 100 generates power when the ducting network 610 carries either relatively hot or cold air as previously described above, e.g., as illustrated by Step 710 of FIG. 7. The power generation system 600 further includes a power storage unit 800 (not shown in FIG. 6) that is at least partially charged based on the power generated by each TE power generation unit 100, e.g., as illustrated by Step 720 of FIG. 7.

A power distribution network 630 carries the power generated by each TE power generation unit 100 to the power storage unit 800. In one embodiment, each unit 100 has a power cable 640 that electrically connects the unit 100 to a junction 650 of the power distribution network 630. The junction 650 may be a plug-type insertion mechanism for receiving one or more of the power cables 640. According to this embodiment, the power distribution network 630 includes one or more separate conductors for each unit 100. The power generated by the units 100 is carried by the conductors to the power storage unit 800. In another embodiment, the junction 650 combines the power generated by the units 100. The outputs of each unit 100 can be combined in any desired serial/parallel combination to yield a desired voltage level. According to this embodiment, the power distribution network 630 includes at least one conductor for carrying the combined power output of the units 100 to the power storage unit 800. Either way, the power distribution network 630 carries the power generated by each TE power generation unit 100 to the power storage unit 800.

Figure 8:
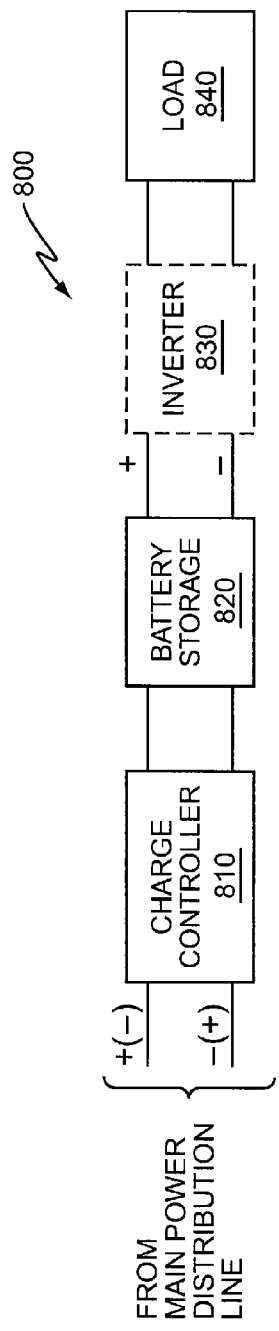
FIG. 8 is a block diagram of an embodiment of a power storage unit at least partially charged by a thermoelectric power generation unit.

FIG. 8 illustrates an embodiment of the power storage unit 800 coupled to the power distribution network 630. According to this embodiment, the power storage unit 800 includes a charge controller 810 and at least one battery cell 820. Each battery cell 820 stores energy and may comprise nickel cadmium, nickel metal hydride, lithium ion, lithium polymer or types of cells. The charge controller 810 charges each battery cell 820 at least partially based on the power generated by the TE power generation units 100. Other sources such as solar cells (not shown) may also contribute to cell charging. In one embodiment, the charge controller 810 converts the voltage output by the power distribution network 630 to a relatively fixed voltage having the same polarity whether the ducting network 610 carries relatively hot or cold air.

The charge controller 810 applies the relatively fixed voltage to the each battery cell 820 for charging the cells 820. Broadly, the charge controller 810 may employ any type of desirable charging technique such as constant voltage charging, constant current charging, taper current charging, pulsed charging, trickle charging, float charging or the like. Moreover, the charge controller 810 may employ any desirable charging rate such as slow charging (e.g., 14 to 16 hours or longer), quick charging (e.g., 3 to 6 hours), fast charging (e.g., one hour or less) or the like. To this end, the charge controller 810 may include a switched mode regulator, linear regulator, shunt regulator, buck regulator, pulsed charger, inductive charger, etc.

The power storage unit 800 may also include an inverter 830 such as a sine wave or modified sine wave inverter for converting DC power stored in the battery cell(s) 820 to AC power for driving an AC load 840. The inverter switches the DC output of the battery cell(s) back and forth to produce AC power. The inverter 830 may also transform and/or filter the AC power to yield a desired AC output waveform. The inverter 830 can be excluded from the power storage unit 800 if the load 840 is a DC load.

Figure 9:
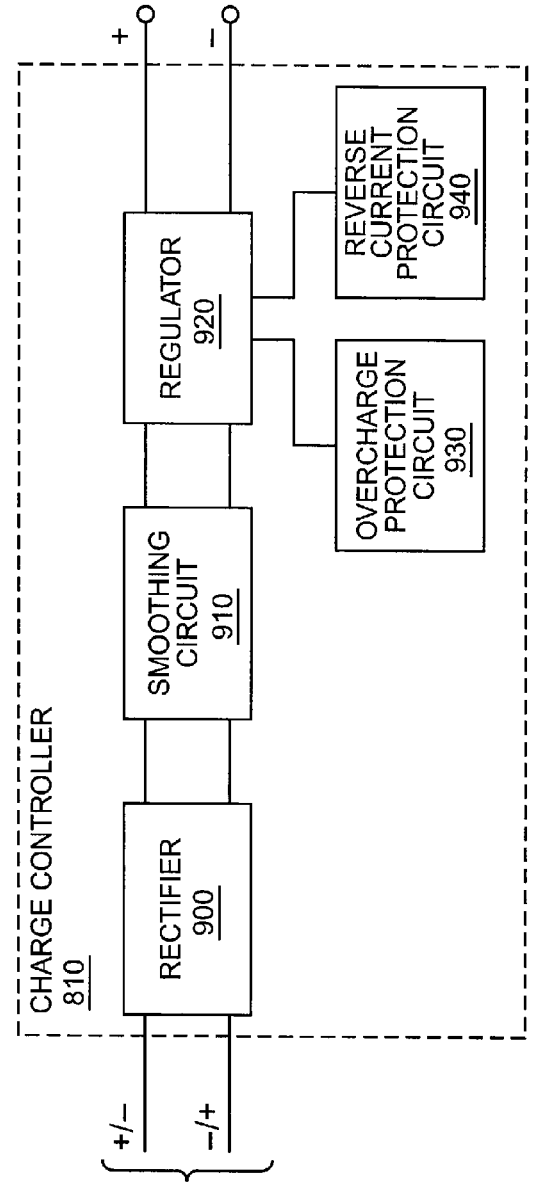
FIG. 9 is a block diagram of an embodiment of a charge controller included in or associated with the power storage unit of FIG. 8.

FIG. 9 illustrates an embodiment of the charge controller 810 included on or associated with the power storage unit 800. According to this embodiment, the charge controller 810 includes a rectifier 900 such as a full-wave or half-wave rectifier that converts either a positive or negative voltage input to a DC voltage with only positive value. The charger controller 810 can also include a smoothing circuit 910 for smoothing the DC voltage so that it has only relatively small or negligible ripples. The smoothing circuit 910 can be included when the voltage input to the charge controller 810 changes often in an alternating current-like manner. This condition occurs when the temperature gradient across the TE modules 102 changes often. Otherwise, the smoothing circuit 910 can be excluded. A regulator 920 effectively eliminates any remaining ripple by setting the DC voltage to a fixed voltage. A transformer (not shown) may be included if the voltage input is relatively high. The transformer reduces or "steps-down" a relatively high input voltage to a relatively low voltage. Alternatively, the transformer can increase or "step-up" a relatively low input voltage to a relatively high voltage. In another embodiment, the charge controller 810 includes a shunt regulator (not shown) for converting the input voltage to a constant DC voltage.

An overcharge protection circuit 930 may be included in or associated with the charge controller 810. The overcharge protection circuit 930 detects when each battery cell 820 is nearly or completely charged and terminates charging accordingly, extending cell life and preventing cell damage. In one embodiment, the overcharge protection circuit 930 detects when the cell termination voltage is reached, i.e., when the voltage of each battery cell 820 rises to a predetermined upper voltage limit. In another embodiment, the overcharge protection circuit 930 monitors cell temperature to determine when cell charging is complete. Broadly, the overcharge protection circuit 930 ensures safe charging of the battery cells 820.

A reverse current protection circuit 940 may also be included in or associated with the charge controller 810. The reverse current protection circuit 940 prevents current from flowing to the TE power generation units 100 from the power storage unit 800. The reverse current protection circuit 940 may include one or more diodes, bipolar transistors, MOSFET transistors, etc. arranged to prevent reverse current from flowing in the power storage unit 800.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A thermoelectric power generation unit, comprising:
   a plurality of walls arranged to form an enclosure with an open interior space, each wall having an inner surface facing toward the open interior space and an outer surface facing away from the open interior space;
   a first heat sink attached to the inner surface of a first one of the walls so that the first heat sink protrudes into the open interior space of the enclosure;
   a second heat sink positioned at the outer surface of the first wall so that the second heat sink protrudes outward from the enclosure and opposes the first heat sink;
   a thermoelectric module interposed between the first and second heat sinks adjacent the first wall, the thermoelectric module including a plurality of p-type and n-type semiconductor elements electrically connected in series and thermally connected in parallel between first and second substrates;
   an inlet in the enclosure that leads into the open interior space;
   an outlet in the enclosure that leads from the open interior space; and
   wherein the thermoelectric module is operable to generate a voltage having a first polarity if a relatively hot fluid flows in the enclosure and the opposite polarity if a relatively cold fluid flows in the enclosure.

2. The thermoelectric power generation unit of claim 1, further comprising a fan fixedly attached to the second heat sink, wherein the fan is operable to be powered based on at least a portion of the voltage generated by the thermoelectric module.

3. The thermoelectric power generation unit of claim 1, further comprising voltage regulation circuitry attached to the thermoelectric power generation unit and operable to convert the voltage output by the thermoelectric module to a relatively fixed voltage having the same polarity whether relatively hot or cold fluid flows in the enclosure.

4. The thermoelectric power generation unit of claim 1, further comprising an indicator operable to indicate when the thermoelectric module is generating a voltage.

5. The thermoelectric power generation unit of claim 1, wherein the inlet comprises an opening formed in one of the walls and a flange positioned adjacent the opening of the inlet, and wherein the outlet comprises an opening formed in a different one of the walls and a flange positioned adjacent the opening of the outlet.

6. The thermoelectric power generation unit of claim 1, wherein the first substrate of the thermoelectric module contacts the first heat sink through an opening formed in the first wall.

7. The thermoelectric power generation unit of claim 6, wherein an inner surface area of the first heat sink contacts the first substrate of the thermoelectric module through the opening formed in the first wall and an outer surface area of the first heat sink contacts the inner surface of the first wall adjacent the opening.

8. A power generation system, comprising:
   a ducting network operable to carry a relatively hot or cold fluid;
   a thermoelectric power generation unit inserted into the ducting network so that the fluid flows through the thermoelectric power generation unit, the thermoelectric power generation unit being operable to generate power when the ducting network carries the relatively hot or cold fluid, the thermoelectric power generation unit comprising:
   a plurality of walls arranged to form an enclosure with an open interior space, each wall having an inner surface facing toward the open interior space and an outer surface facing away from the open interior space;
   a first heat sink attached to the inner surface of a first one of the walls so that the first heat sink protrudes into the open interior space of the enclosure;
   a second heat sink positioned at the outer surface of the first wall so that the second heat sink protrudes outward from the enclosure and opposes the first heat sink;
   a thermoelectric module interposed between the first and second heat sinks adjacent the first wall, the thermoelectric module including a plurality of p-type and n-type semiconductor elements electrically connected in series and thermally connected in parallel between first and second substrates;
   an inlet in the enclosure that leads into the open interior space and which is connected to a first duct of the ducting network;
   an outlet in the enclosure that leads from the open interior space and which is connected to a second duct of the ducting network;

a power storage unit operable to store energy at least partially based on the power generated by the thermoelectric power generation unit; and a power distribution network operable to carry the power generated by the thermoelectric power generation unit to the power storage unit.

9. The power generation system of claim 8, wherein the inlet of the thermoelectric power generation unit comprises an opening formed in one of the walls and a flange connected to the first duct of the ducting network and the outlet of the thermoelectric power generation unit comprises an opening formed in a different one of the walls and a flange connected to the second duct of the ducting network.

10. The power generation system of claim 8, wherein the power storage unit comprises at least one battery cell operable to store energy and a charge controller operable to charge the at least one battery cell at least partially based on the power generated by the thermoelectric power generation unit.

11. The power generation system of claim 10, wherein the charge controller is operable to convert a voltage output by the thermoelectric power generation unit to a relatively fixed voltage having the same polarity whether the ducting network carries the relatively hot or cold fluid and apply the relatively fixed voltage to the at least one battery cell.

12. The power generation system of claim 8, further comprising a fan fixedly attached to the second heat sink, the fan operable to be powered based on at least a portion of the power generated by the thermoelectric power generation unit.

13. The power generation system of claim 8, further comprising an indicator attached to the thermoelectric power generation unit and operable to indicate when the thermoelectric power generation unit is generating a voltage.

14. The power generation system of claim 8, further comprising an inverter operable to convert a direct current output of the power storage unit to an alternating current output.

15. A method of generating power, the method comprising:
providing a thermoelectric power generation unit including a plurality of walls arranged to form an enclosure with an open interior space, each wall having an inner surface facing toward the open interior space and an outer surface facing away from the open interior space, a first heat sink attached to the inner surface of a first one of the walls so that the first heat sink protrudes into the open interior space of the enclosure, a second heat sink positioned at the outer surface of the first wall so that the second heat sink protrudes outward from the enclosure and opposes the first heat sink, a thermoelectric module interposed between the first and second heat sinks adjacent the first wall, the thermoelectric module including a plurality of p-type and n-type semiconductor elements electrically connected in series and thermally connected in parallel between first and second substrates, an inlet in the enclosure that leads into the open interior space, and an outlet in the enclosure that leads from the open interior space;

attaching the inlet to a first duct of a ducting network operable to carry a relatively hot or cold fluid;

attaching the outlet to a second duct of the ducting network so that the fluid flows through the thermoelectric power generation unit;

generating power by the thermoelectric power generation unit when the ducting network carries the relatively hot or cold fluid; and storing energy at least partially based on the power generated by the thermoelectric power generation unit.

16. The method of claim 15, comprising:
attaching the first duct to a flange of the inlet; and
attaching the second duct to a flange of the outlet.

17. The method of claim 15, wherein storing energy based on the power generated by the thermoelectric power generation unit comprises:
converting a voltage output by the thermoelectric power generation unit to a relatively fixed voltage having the same polarity whether the ducting network carries the relatively hot or cold fluid; and
applying the relatively fixed voltage to at least one battery cell.

18. The method of claim 15, further comprising powering a fan fixedly attached to the second heat sink based on at least a portion of the power generated by the thermoelectric power generation unit.

19. The method of claim 15, further comprising indicating when the thermoelectric power generation unit is generating a voltage.

20. The thermoelectric power generation unit of claim 1, further comprising an insulating material arranged on at least a portion of the outer surface of the first wall with an opening for receiving the thermoelectric module.

\* \* \* \* \*